(12) United States Patent
Arora et al.

(10) Patent No.: US 12,136,460 B2
(45) Date of Patent: *Nov. 5, 2024

(54) FLOATING DATA LINE CIRCUIT AND METHOD

(71) Applicant: TAIWAN SEMICONDUCTOR MANUFACTURING COMPANY, LTD., Hsinchu (TW)

(72) Inventors: Manish Arora, Hsinchu (TW); Yen-Huei Chen, Hsinchu (TW); Hung-Jen Liao, Hsinchu (TW); Nikhil Puri, Hsinchu (TW); Yu-Hao Hsu, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/362,549

(22) Filed: Jul. 31, 2023

(65) Prior Publication Data

US 2023/0395160 A1 Dec. 7, 2023

Related U.S. Application Data

(63) Continuation of application No. 17/313,404, filed on May 6, 2021, now Pat. No. 11,798,632, which is a
(Continued)

(51) Int. Cl.
*G11C 16/24* (2006.01)
*G11C 7/12* (2006.01)
(Continued)

(52) U.S. Cl.
CPC ............... *G11C 16/24* (2013.01); *G11C 7/12* (2013.01); *G11C 11/005* (2013.01);
(Continued)

(58) Field of Classification Search
CPC ......... G11C 16/24; G11C 7/12; G11C 11/005; G11C 16/0483; H10B 41/35; H10B 41/20
(Continued)

(56) References Cited

U.S. PATENT DOCUMENTS 4,661,931 A 4/1987 Flannagan et al.
5,959,916 A 9/1999 Kumar
(Continued)

FOREIGN PATENT DOCUMENTS

CN 104937668 9/2015
EP 0698885 1/2000
(Continued)

OTHER PUBLICATIONS

Seungjin Lee et al., "Energy-Efficient Write Circuit in STT-MRAM Based Look-Up Table(LUT) Using Comparison Write Scheme," School of Electrical and Electronic Engineering, Yonsei University, Seoul, Korea, ISOCC 2017. May 31, 2018, pp. 288-289.
(Continued)

*Primary Examiner* — Huan Hoang
(74) *Attorney, Agent, or Firm* — Hauptman Ham, LLP

(57) ABSTRACT

A memory circuit includes first and second memory segments coupled to first and second write lines, and first and second write line circuits coupled to the first and second write lines and configured to receive first and second data signals. The first and second data signals have complementary low and high logical states during a write operation to the first or second memory segment, and each of the first and second data signals has the low logical state during a masked write operation to the first or second memory segment. The first and second write line circuits output, to the first and second write lines, first and second write line signals respon-
(Continued)

sive to the first and second data signals during the write operation and float the first and second data lines during the masked write operation.

20 Claims, 6 Drawing Sheets

Related U.S. Application Data continuation of application No. 16/204,268, filed on Nov. 29, 2018, now Pat. No. 11,011,238.

(60) Provisional application No. 62/691,599, filed on Jun. 28, 2018.

(51) Int. Cl.
  *G11C 11/00* (2006.01)
  *G11C 16/04* (2006.01)
  *H10B 41/20* (2023.01)
  *H10B 41/35* (2023.01)

(52) U.S. Cl.
  CPC ......... *G11C 16/0483* (2013.01); *H10B 41/20* (2023.02); *H10B 41/35* (2023.02)

(58) Field of Classification Search
  USPC .................................................. 365/185.23
  See application file for complete search history.

(56) References Cited

U.S. PATENT DOCUMENTS

| 6,104,648 | A | 8/2000 | Ooishi |
| 6,337,822 | B1 | 1/2002 | Kwak et al. |
| 6,504,775 | B1 | 1/2003 | Ma et al. |
| 6,668,345 | B1 | 12/2003 | Ooishi et al. |
| 8,339,838 | B2 | 12/2012 | Ramaraju |
| 8,619,482 | B1 | 12/2013 | Bui et al. |
| 9,097,764 | B2 | 8/2015 | Parikh et al. |
| 9,536,593 | B1 | 1/2017 | Peterson et al. |
| 9,734,886 | B1 | 8/2017 | Derner et al. |
| 11,011,238 | B2 * | 5/2021 | Arora ........................ G11C 7/12 |
| 11,798,632 | B2 * | 10/2023 | Arora ................. G11C 16/0483 |
| 2007/0002615 | A1 | 1/2007 | Lee et al. |
| 2008/0002496 | A1 | 1/2008 | Kim |
| 2009/0086537 | A1 | 4/2009 | Kitagawa |
| 2009/0135229 | A1 | 5/2009 | Kurokawa et al. |
| 2012/0327703 | A1 * | 12/2012 | Yanni ................. G11C 11/4091 |
| | | | 711/E12.024 |
| 2019/0147924 | A1 | 5/2019 | Bringivijayraghavan et al. |

FOREIGN PATENT DOCUMENTS

| JP | 2004348836 | 12/2004 |
| KR | 0156826 | 12/1998 |
| KR | 20010003828 | 1/2001 |
| WO | 2005038812 | 4/2005 |
| WO | 2005078732 | 8/2005 |
| WO | 2007099623 | 9/2007 |

OTHER PUBLICATIONS

Office Action dated Apr. 6, 2020 from corresponding application No. TW 108122314.
Office Action dated Dec. 24, 2021 for corresponding case No. KR 10-2020-0160255. English translation attached on p. 1. (pp. 1-3).

* cited by examiner

600

610 — Couple a data line with a power supply node using a pre-charging circuit

620 — Decouple the data line from the power supply node using the pre-charging circuit 630 — Receive a first data signal at a first input node of a driving circuit coupled with the data line, the power supply node, and a reference node, and a second data signal at a second input node of the driving circuit

640 — In response to the first data signal and the second data signal, use the driving circuit to decouple the data line from the power supply node and the reference node

650 — Repeat operation 610

660 — Use the driving circuit to output one of a power supply voltage level or a reference voltage level on the data line

FIG. 6

FLOATING DATA LINE CIRCUIT AND METHOD

PRIORITY CLAIM

The present application is a continuation of U.S. application Ser. No. 17/313,404, filed May 6, 2021, now U.S. Pat. No. 11,798,632, issued on Oct. 24, 2023, which is a continuation of U.S. application Ser. No. 16/204,268, filed Nov. 29, 2018, now U.S. Pat. No. 11,011,238, issued May 18, 2021, which claims the priority of U.S. Provisional Application No. 62/691,599, filed Jun. 28, 2018, each of which is incorporated herein by reference in its entirety.

BACKGROUND

Memory arrays often include memory cells arranged in columns corresponding to bit locations and rows corresponding to word locations. In such arrangements, during read and write operations, the memory cells associated with a given word are activated through one or more word lines at a row location corresponding to the given word, and data are transferred to and from the memory cells through one or more data lines at column locations corresponding to bits of the given word.

Input-output (IC)) circuits used to transfer data in read and write operations are sometimes shared among multiple columns within segments of the array, each column being selectable through a switching circuit. In some cases, one or more bits of a word are masked by IO circuits so that data are written to a subset of the memory cells associated with the word during a write operation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 6 is a flowchart of a method of floating a data line, in accordance with some embodiments.

DETAILED DESCRIPTION

Figure 1:
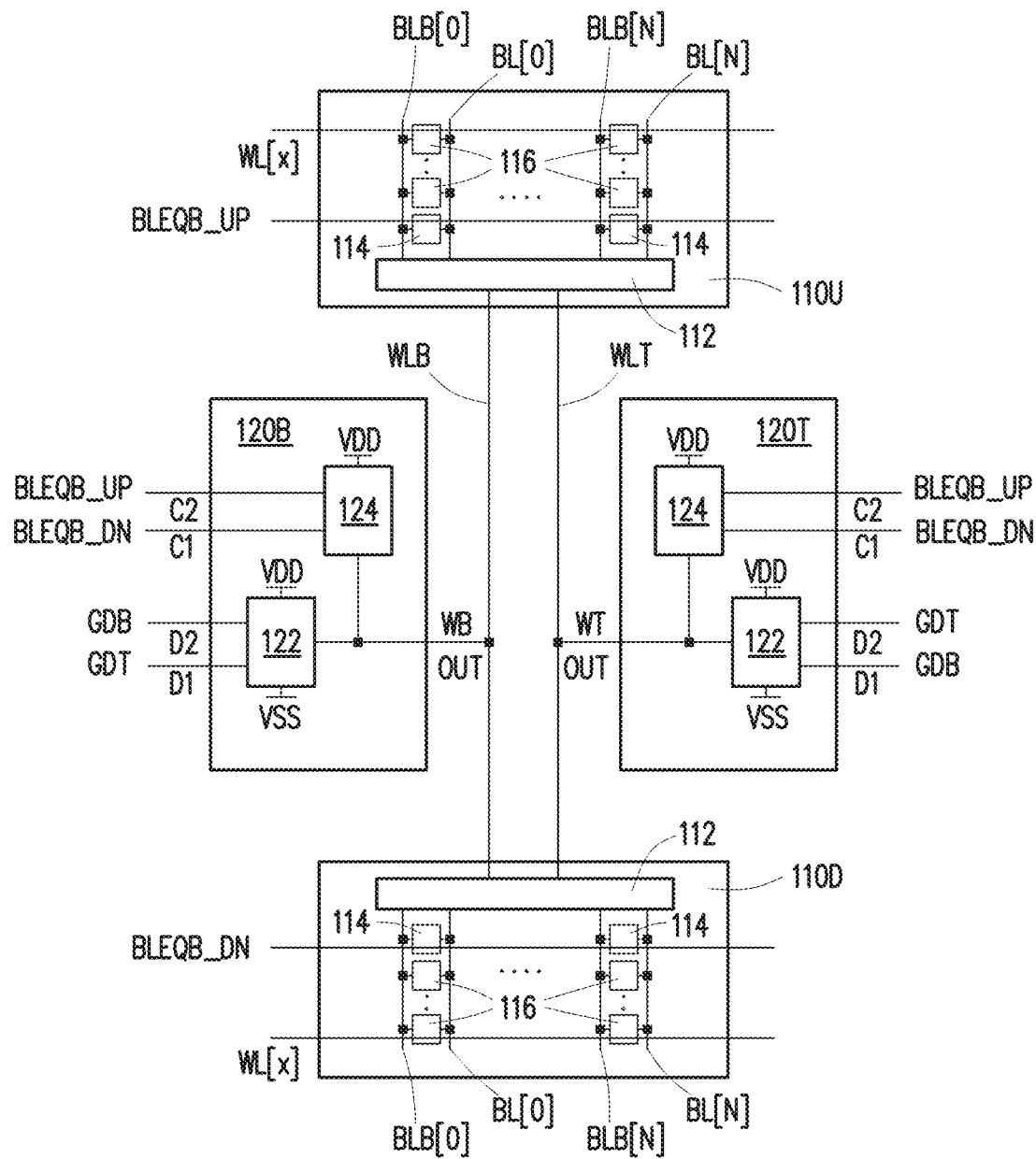
FIG. 1 is a diagram of a memory circuit, in accordance with some embodiments.

The following disclosure provides many different embodiments, or examples, for implementing different features of the provided subject matter. Specific examples of components, values, operations, materials, arrangements, or the like, are described below to simplify the present disclosure. These are, of course, merely examples and are not intended to be limiting. Other components, values, operations, materials, arrangements, or the like, are contemplated. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In various embodiments, a write line circuit of a memory circuit includes power supply and reference nodes that carry power supply and reference voltage levels, first, second, and third input nodes that receive first and second data signals and a control signal, and an output node. Responsive to the first and second data signals and the control signal, the write line circuit either outputs one of the power supply or reference voltage levels on the output node, or floats the output node.

The write line circuit is thereby capable of driving a data line to logically high and low states during write operations, floating the data line during masked write operations and, in some embodiments, pre-charging the data line to the logically high state between write operations. Compared to approaches that do not enable floating a data line during a masked write operation, the write line circuit reduces current flow in a selected memory cell and associated bit and data lines, thereby improving circuit reliability and energy efficiency. By pre-charging the data line between write operations, the write line circuit prevents the data line from discharging toward the reference voltage level, thereby avoiding possible increases in current flow and write times.

FIG. 1 is a diagram of a memory circuit 100, in accordance with some embodiments. Memory circuit 100 includes segments 110U and 110D, each electrically coupled with a write line WLB and a write line WLT. A write line circuit 120B is electrically coupled with write line WLB, and a write line circuit 120T is electrically coupled with write line WLT.

Two or more circuit elements are considered to be electrically coupled based on a direct electrical connection or an electrical connection that includes one or more additional circuit elements and is thereby capable of being controlled, e.g., made resistive or open by a transistor or other switching device.

Memory circuit 100 is a subset of a memory macro (not shown) that includes one or more additional components, e.g., at least one segment (not shown) in addition to segments 110U and 110D and/or at least one write line circuit (not shown) in addition to write line circuits 120B and 120T. In various embodiments, memory circuit does not include one or more of segment 110U, segment 110D, write line circuit 120B, write line circuit 120T, write line WLB, or write line WLT.

Each of segments 110U and 110D is a segment of a memory array of the memory macro and includes a selection circuit 112 electrically coupled with a plurality of N complementary bit line pairs BL[0 . . . N]/BLB[0 . . . N]. Each bit line pair BL[n]/BLB[n] is electrically coupled with a bit line pre-charger 114 and with a plurality of memory cells 116. In various embodiments, at least one of segments 100U or 110D includes a plurality of individual bit lines, e.g., either BL[0 . . . N] or BLB[0 . . . N], instead of plurality of bit line pairs BL[0 . . . N]/BLB[0 . . . N].

Write lines WLB and WLT and bit line pairs BL[0 . . . N]/BLB[0 . . . N] of segments 110U and 110D are data lines including conductive elements capable of transferring voltage levels to and/or from plurality of memory cells 116.

In some embodiments, each of segments 110U and 110D includes four bit line pairs. In various embodiments, one or both of segments 110U or 110D includes fewer or greater than four bit line pairs.

In the embodiment depicted in FIG. 1, segment 110U is oriented in an upward direction relative to write line circuits 120B and 120T, and segment 110D is oriented in a downward direction relative to write line circuits 120B and 120T. In various embodiments, segments 110U and 110D have orientations other than those depicted in FIG. 1.

Selection circuit 112 is configured to selectively couple write line WLT with a bit line BL[n] and write line WLB with a bit line BLB[n] responsive to a selection signal (not shown) having a state corresponding to selection of bit line pair BL[n]/BLB[n]. In some embodiments, selection circuit 112 includes a multiplexer.

Bit line pre-charger 114 includes a circuit configured to charge a given bit line pair to a power supply voltage level responsive to a pre-charge enable signal. Segment 110U is configured so that bit line pre-charger 114 receives a pre-charge enable signal BLEQB_UP on an enable line (not labeled), and segment 110D is configured so that bit line pre-charger 114 receives a pre-charge enable signal BLEQB_DN on an enable line (not labeled).

Each plurality of memory cells 116 is arranged as a column of the memory array. In various embodiments, a column of memory cells 116 includes a number of memory cells 116 ranging from 128 to 1024, fewer than 128, or greater than 1024.

A given plurality of memory cells 116 includes electrical, electromechanical, electromagnetic, or other devices (not individually labeled) configured to store bit data represented by logical states. The logical states of a memory cell 116 are capable of being programmed in a write operation and detected in a read operation.

In some embodiments, a logical state corresponds to a voltage level of an electrical charge stored in a given memory cell. In some embodiments, a logically high state corresponds to a power supply voltage level of memory circuit 100 and a logically low state corresponds to a reference voltage level of memory circuit 100. In some embodiments, a logical state corresponds to a physical property, e.g., a resistance or magnetic orientation, of a component of a given memory cell.

In some embodiments, plurality of memory cells 116 includes static random-access memory (SRAM) cells. In various embodiments, SRAM cells include five-transistor (5T) SRAM cells, six-transistor (6T) SRAM cells, eight-transistor (8T) SRAM cells, nine-transistor (9T) SRAM cells, or SRAM cells having other numbers of transistors. In some embodiments, plurality of memory cells 116 includes dynamic random-access memory (DRAM) cells or other memory cell types capable of storing bit data.

A plurality of word lines, represented in FIG. 1 by an example word line WL[x], intersects bit line pairs BL[0 . . . N]/BLB[0 . . . N]. Memory circuit 100 is thereby configured so that a given word line, e.g., word line WL[x], is communicatively coupled with one memory cell 116 in each column of memory cells 116 of a given one of segments 110U or 110D.

Two or more circuit elements are considered to be communicatively coupled based on a direct signal connection or on an indirect signal connection that includes one or more logic devices, e.g., an inverter or logic gate, between the two or more circuit elements. In some embodiments, signal communications between the two or more communicatively coupled circuit elements are capable of being modified, e.g., inverted or made conditional, by the one or more logic devices.

In operation, a memory cell 116 at a location corresponding to bit line pair BL[n]/BLB[n] and word line WL[x] is electrically coupled with one or both of write line WLT or WLB through bit line pair BL[n]/BLB[n] responsive to a word line signal (not labeled) on word line WL[x], and through the corresponding selection circuit 112 responsive to the selection signal having the state corresponding to selection of bit line pair BL[n]/BLB[n].

Each of write line circuits 120B and 120T includes a driving circuit 122 and a pre-charge circuit 124. Driving circuit 122 is electrically coupled between a power supply node VDD, configured to carry the power supply voltage level of memory circuit 100, a reference node VSS, configured to carry the reference voltage level of memory circuit 100, and an output node OUT. Pre-charge circuit 124 is electrically coupled between power supply node VDD and output node OUT.

In various embodiments, memory circuit 100 is part of a larger system, e.g., a system on a chip, and the power supply voltage level of memory circuit 100 corresponds to an operational voltage level of the system or to a memory-specific operational voltage level. In various embodiments, memory circuit 100 is part of a larger system, and the reference voltage level of memory circuit 100 corresponds to a reference voltage level of the system or to a memory-specific reference voltage level. In some embodiments, reference node VSS is a ground voltage node having a ground voltage level.

Driving circuit 122 is communicatively coupled with input nodes D1 and D2 and electrically coupled with output node OUT, and pre-charge circuit 124 is communicatively coupled with input nodes C1 and C2.

In the embodiment depicted in FIG. 1, write line circuit 120B is configured to receive a data signal GDT at input node D1, a data signal GDB at input node D2, pre-charge enable signal BLEQB_DN at input node C1, and pre-charge enable signal BLEQB_UP at input node C2, and to output a write line signal WB at output node OUT electrically coupled with write line WLB.

In the embodiment depicted in FIG. 1, write line circuit 120T is configured to receive data signal GDB at input node D1, data signal GDT at input node D2, pre-charge enable signal BLEQB_DN at input node C1, and pre-charge enable signal BLEQB_UP at input node C2, and to output a write line signal WT at output node OUT electrically coupled with write line WLT.

A given driving circuit 122 is configured to, responsive to logical states of data signals received at input nodes D1 and D2, either output one of the power supply voltage level or the reference voltage level at output node OUT or float output node OUT by having a high output impedance at output node OUT.

Driving circuit 122 is configured to output the write line signal having one of the power supply voltage level or the reference voltage level at output node OUT responsive to the logical state of the data signal received at input node D1. In various embodiments, driving circuit 122 is configured to output the write line signal having the power supply voltage level responsive to one of a low or a high logical state at input node D1, and to output the write line signal having the reference voltage level responsive to the other of the low or the high logical state at input node D1.

In some embodiments, driving circuit 122 includes an inverter, e.g., transistors N1 and P1 discussed below with respect to FIGS. 2 and 3, and is thereby configured to output the write line signal having the power supply voltage level responsive to the low logical state at input node D1, and to output the write line signal having the reference voltage level responsive to the high logical state at input node D1.

In the embodiment depicted in FIG. 1, write line circuit 120B includes driving circuit 122 configured to receive data signal GDT at input node D1, and is thereby configured to output write line signal WB having one of the power supply voltage level or the reference voltage level to write line WLB responsive to the logical state of data signal GDT.

In the embodiment depicted in FIG. 1, write line circuit 120T includes driving circuit 122 configured to receive data signal GDB at input node D1, and is thereby configured to output write line signal WT having one of the power supply voltage level or the reference voltage level to write line WLT responsive to the logical state of data signal GDB.

Driving circuit 122 is configured to either float output node OUT or output the write line signal having one of the power supply voltage level or the reference voltage level responsive to the logical states of the data signals received on input nodes D1 and D2. In various embodiments, driving circuit 122 is configured to float output node OUT responsive to one or more combinations of a low or high logical state at input node D1 and a low or high logical state at input node D2, and to output the write line signal having one of the power supply voltage level or the reference voltage level responsive to one or more other combinations of the low or high logical state at input node D1 and the low or high logical state at input node D2.

In the embodiment depicted in FIG. 1, driving circuit 122 is configured to, in operation, float output node OUT in response to the low logical state at each of input nodes D1 and D2, output the write line signal having the power supply voltage level in response to the low logical state at input node D1 and the high logical state at input node D2, and output the write line signal having the reference voltage level in response to the high logical state at input node D1 and either the low or the high logical state at input node D2.

In various embodiments, driving circuit 122 is configured to have the high output impedance at output node OUT by including one or more switching devices (not depicted in FIG. 1) electrically coupled with output node OUT. A switching device includes one or more electrical or electromechanical constructions capable of making and breaking electrical connections between two or more terminals responsive to voltage levels representing logical states received at one or more control terminals. In various embodiments, a switching device includes one or more of a transistor, transmission gate, or other device suitable for controlling electrical connections.

In various embodiments, a transistor includes one or a combination of a field-effect transistor (FET), a metal-oxide-semiconductor field-effect transistor (MOSFET), a fin field-effect transistor (FinFET), an n-type transistor, a p-type transistor, a vertical gate transistor, a bipolar or other transistor type.

In some embodiments, driving circuit 122 includes one or more switching devices, e.g., a transistor P2 discussed below with respect to FIG. 2, configured to selectively decouple driving circuit 122 from power supply node VDD responsive to the data signal received at input node D2, and is thereby at least partially capable of having the high output impedance at output node OUT.

In some embodiments, driving circuit 122 includes one or more switching devices, e.g., transistor N1 discussed below with respect to FIGS. 2 and 3, configured to selectively decouple driving circuit 122 from reference node VSS responsive to the data signal received at input node D1, and is thereby at least partially capable of having the high output impedance at output node OUT.

In some embodiments, driving circuit 122 includes one or more switching devices, e.g., a transistor P3 discussed below with respect to FIG. 3, configured to selectively decouple driving circuit 122 from output node OUT responsive to the data signals received at input nodes D1 and D2, and is thereby at least partially capable of having the high output impedance at output node OUT.

In various embodiments, driving circuit 122 includes one or more logic gates, e.g., a NOR gate NOR1 discussed below with respect to FIG. 3, configured to receive the data signals at one or both of input nodes D1 or D2 and generate one or more switching signals capable of controlling one or more switching devices, driving circuit 122 thereby being configured to be at least partially capable of having the high output impedance at output node OUT. In various embodiments, driving circuit 122 includes one or more of an inverter, OR gate, NOR gate, XOR gate, AND gate, NAND gate, or other logic gate suitable for applying a logic scheme.

In the embodiment depicted in FIG. 1, write line circuit 120B includes driving circuit 122 configured to receive data signals GDT and GDB at respective input nodes D1 and D2, and is thereby configured to either float write line WLB or output write line signal WB having one of the power supply voltage level or the reference voltage level to write line WLB responsive to the logical states of data signals GDT and GDB.

In the embodiment depicted in FIG. 1, write line circuit 120T includes driving circuit 122 configured to receive data signals GDB and GDT at respective input nodes D1 and D2, and is thereby configured to either float write line WLT or output write line signal WT having one of the power supply voltage level or the reference voltage level to write line WLT responsive to the logical states of data signals GDB and GDT.

A given pre-charge circuit 124 is configured to, responsive to logical states of enable signals received at input nodes C1 and C2, either output the power supply voltage level at output node OUT or float output node OUT by having a high output impedance at output node OUT. In operation, a pre-charge circuit 124 floating the associated output node OUT allows the associated driving circuit 122 to control output node OUT, and a given driving circuit 122 floating the associated output node OUT allows the associated pre-charge circuit 124 to control output node OUT.

By including driving circuit 122 and pre-charge circuit 124 as depicted in FIG. 1, write line circuits 120B and 120T are configured to either output the write line signal having one of the power supply voltage level or the reference voltage level at output node OUT, or float output node OUT responsive to a combination of the data signals received at input nodes D1 and D2 and the enable signals received at input nodes C1 and C2.

In various embodiments, pre-charge circuit 124 is configured to output the power supply voltage level responsive to one or more combinations of a low or high logical state at input node C 1 and a low or high logical state at input node C2, and to float output node OUT responsive to one or more other combinations of the low or high logical state at input node C1 and the low or high logical state at input node C2.

In some embodiments, one or both of write line circuits 120B and 120T does not include one of input nodes C1 or C2, and pre-charge circuit 124 is configured to either output the power supply voltage level at output node OUT or float output node OUT responsive to a low or high logical state at a single input node C 1 or C2. In some embodiments, one or both of write line circuits 120B and 120T includes one or more input nodes (not shown) in addition to input nodes C 1 and C2, and pre-charge circuit 124 is configured to either output the power supply voltage level at output node OUT or float output node OUT responsive to combinations of the low or high logical states at some or all of the input nodes.

In some embodiments, one or both of write line circuits 120B or 120T does not include pre-charge circuit 124, and the one or both of write line circuits 120B or 120T is configured to either output the write line signal having one of the power supply voltage level or the reference voltage level at output node OUT or float output node OUT responsive solely to the data signals received at input nodes D1 and D2.

In some embodiments, pre-charge circuit 124 includes a switching device, e.g., a transistor P4 discussed below with respect to FIG. 4, configured to selectively decouple output node OUT from power supply node VDD responsive to the enable signal received at input node C 1, and is thereby at least partially capable of having the high output impedance at output node OUT.

In some embodiments, pre-charge circuit 124 includes a switching device, e.g., a transistor P5 discussed below with respect to FIG. 4, configured to selectively decouple output node OUT from power supply node VDD responsive to the enable signal received at input node C2, and is thereby at least partially capable of having the high output impedance at output node OUT.

In some embodiments, pre-charge circuit 124 includes a single switching device, e.g., one of transistors P4 or P5 discussed below with respect to FIG. 4, configured to selectively decouple output node OUT from power supply node VDD responsive to the enable signals received at both of input nodes C1 and C2, and is thereby at least partially capable of having the high output impedance at output node OUT. In some embodiments, pre-charge circuit 124 includes one or more logic circuits (not shown) configured to control a switching device responsive to the enable signals received at both of input nodes C1 and C2.

In the embodiment depicted in FIG. 1, each of write line circuits 120B and 120T includes pre-charge circuit 124 configured to receive enable signal BLEQB_DN at input node C1 and enable signal BLEQB_UP at input node C2. Write line circuit 120B is thereby configured to either output the power supply voltage level to write line WLB or float write line WLB responsive to the logical states of enable signals BLEQB_DN and BLEQB_UP, and write line circuit 120T is thereby configured to either output the power supply voltage level to write line WLT or float write line WLT responsive to the logical states of enable signals BLEQB_DN and BLEQB_UP.

Memory circuit 100 is configured so that, between write operations, enable signals BLEQB_DN and BLEQB_UP are received at respective input nodes C1 and C2 having logical states that cause pre-charge circuit 124 to output the power supply voltage level to output node OUT, and, during write operations, enable signals BLEQB_DN and BLEQB_UP are received at respective input nodes C1 and C2 having logical states that cause pre-charge circuit 124 to float output node OUT.

Between write operations, pre-charge circuit 124 outputting the power supply voltage level to output node OUT enables write line circuit 120B to maintain write line WLB at the power supply voltage level, and enables write line circuit 120T to maintain write line WLT at the power supply voltage level. During write operations, pre-charge circuit 124 floating output node OUT enables write line WLB to be controlled by driving circuit 122 of write line circuit 120B, and enables write line WLT to be controlled by driving circuit 122 of write line circuit 120T.

During a write operation in which a data bit is being written to a memory cell 116 in a selected bit line pair BL[n]/BLB[n] of either of segments 110U or 110D, memory circuit 100 is configured so that data signals GDT and GDB are received as a complementary pair. During the write operation in which data signals GDT and GDB are received as a complementary pair, based on the configuration discussed above, write line circuit 120B outputs write line signal WB having one of the power supply voltage level or the reference voltage level to write line WLB, and write line circuit 120T outputs write line signal WT having the other of the power supply voltage level or the reference voltage level to write line WLT.

During a write operation in which a data bit corresponding to a memory cell 116 in a selected bit line pair BL[n]/BLB[n] of either of segments 110U or 110D is masked, memory circuit 100 is configured so that each of data signals GDT and GDB is received having the low logical state. During the write operation in which data signals GDT and GDB are received having the low logical state, based on the configuration discussed above, write line circuit 120B floats write line WLB, and write line circuit 120T floats write line WLT.

In some embodiments, during a write operation in which a data bit corresponding to a memory cell 116 in a selected bit line pair BL[n]/BLB[n] of either of segments 110U or 110D is masked, memory circuit 100 is configured so that each of data signals GDT and GDB is received having the high logical state, and, based on the configuration discussed above, write line circuit 120B floats write line WLB, and write line circuit 120T floats write line WLT.

As discussed above, memory circuit 100 is configured so that, during a write operation, in some embodiments, a selected memory cell 116 is electrically coupled with the corresponding bit line pair BL[n]/BLB[n] in response to the word line signal on the corresponding word line WL[x], and the bit line pair BL[n]/BLB[n] is electrically coupled with respective write lines WLT and WLB through selection circuit 112.

In the case in which the data bit is not masked in the write operation, write line circuits 120B and 120T outputting respective write line signals WB and WT having the power supply and reference voltage levels as a complementary pair cause the data bit to be written to the selected memory cell 116.

In the case in which the data bit is masked in the write operation, write line circuits 120B and 120T floating respective write lines WLB and WLT cause the selected memory cell 116 to be electrically coupled with floating respective bit lines BLB [n] and BL[n].

Compared to approaches in which a selected memory cell is electrically coupled with bit lines that are not floating during a write operation in which a data bit is masked, e.g., approaches in which bit lines are held at or near a power supply voltage level during a write operation in which a data bit is masked, the configuration of memory circuit 100 reduces current flow in the selected cell and associated bit lines and write lines, thereby improving circuit reliability and energy efficiency.

The benefits discussed above are further achieved by memory circuit 100 being configured to maintain write lines WLB and WLT at the power supply voltage level between write operations, thereby preventing one or both of write lines WLB or WLT from discharging through leakage currents to a voltage level at or near the reference voltage level, in which case a memory cell could be unintentionally programmed during a masked write operation.

Figure 2:
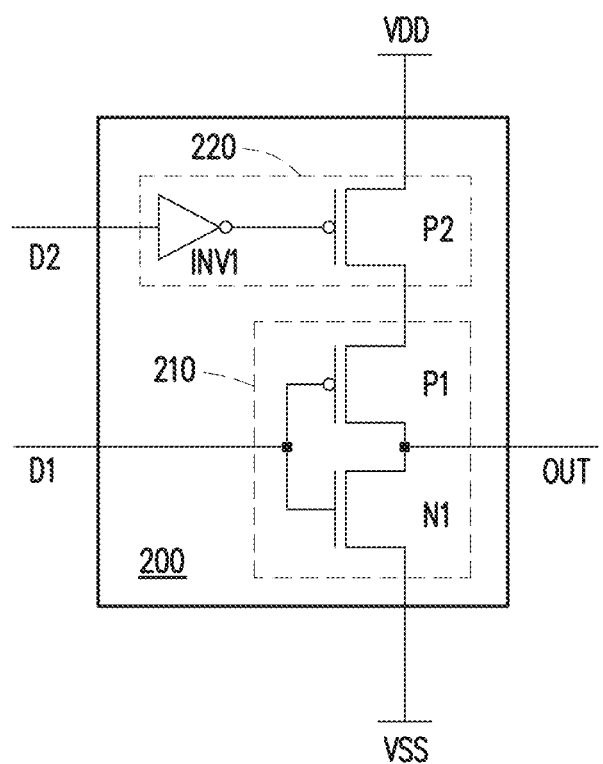
FIG. 2 is a diagram of a driving circuit, in accordance with some embodiments.

FIG. 2 is a diagram of a driving circuit 200, in accordance with some embodiments. Driving circuit 200 is usable as a driving circuit 122 discussed above with respect to FIG. 1. Driving circuit 200 includes PMOS transistors P1 and P2 and NMOS transistor N1 electrically coupled in series between power supply node VDD and reference node VSS.

Transistors N1 and P1 are configured as an inverter, also referred to as a write driver 210, in which a source of transistor N1 is electrically coupled with reference node VSS, a drain of transistor N1 is electrically coupled with a drain of transistor P1, and a gate of transistor N1 is communicatively coupled with a gate of transistor P1. A source of transistor P1 is electrically coupled with a drain of transistor P2, and a source of transistor P2 is electrically coupled with power supply node VDD.

The gates of transistors N1 and P1 are communicatively coupled with input node D1, and the drains of transistors N1 and P1 are electrically coupled with output node OUT. An inverter INV1 is coupled between input node D2 and a gate of transistor P2, with an input terminal (not labeled) communicatively coupled with input node D1, and an output terminal (not labeled) communicatively coupled with the gate of transistor P2.

In operation, the low logical state at input node D1 is received at the gates of transistors N1 and P1, thereby turning off transistor N1 and decoupling output node OUT from reference node VSS, and turning on transistor P1 and electrically coupling output node OUT with the drain of transistor P2. The high logical state at input node D1 is received at the gates of transistors N1 and P1, thereby turning on transistor N1 and electrically coupling output node OUT with reference node VSS, and turning off transistor P1 and decoupling output node OUT from the drain of transistor P2.

In operation, the low logical state at input node D2 is inverted by inverter INV1 to the high logical state at the gate of transistor P2, thereby turning off transistor P2 and decoupling the source of transistor P1 from power supply node VDD. The high logical state at input node D2 is inverted by inverter INV1 to the low logical state at the gate of transistor P2, thereby turning on transistor P2 and electrically coupling the source of transistor P1 with power supply node VDD.

Inverter INV1 and transistor P2 are also referred to as an interrupt circuit 220. In some embodiments, driving circuit 200 includes an interrupt circuit 220 that does not include inverter INV1, and in which transistor P2 is an NMOS transistor. In these embodiments, in operation, the low logical state at input node D2 turns off transistor P2, and the high logical state at input node D2 turns on transistor P2.

In operation, the low logical state at input nodes D1 and D2, by turning off transistors N1 and P2, decouples output node OUT from both reference node VSS and power supply node VDD, thereby floating output node OUT by having a high impedance at output node OUT.

In operation, the low logical state at input node D1 and the high logical state at input node D2, by turning off transistor N1 and turning on transistors P1 and P2, decouples output node OUT from reference node VSS and electrically couples output node OUT with power supply node VDD, thereby outputting the power supply voltage level on output node OUT.

In operation, the high logical state at input node D1 and the low logical state at input node D2, by turning on transistor N1, and turning off transistors P1 and P2, electrically couples output node OUT with reference node VSS and decouples output node OUT from power supply node VDD, thereby outputting the reference voltage level on output node OUT.

In operation, the high logical state at input node D1 and the high logical state at input node D2, by turning on transistors N1 and P2, and turning off transistor P1, electrically couples output node OUT with reference node VSS and decouples output node OUT from power supply node VDD, thereby outputting the reference voltage level on output node OUT.

By the configuration discussed above, driving circuit 200 is capable of enabling the benefits discussed above with respect to memory circuit 100 and FIG. 1.

Figure 3:
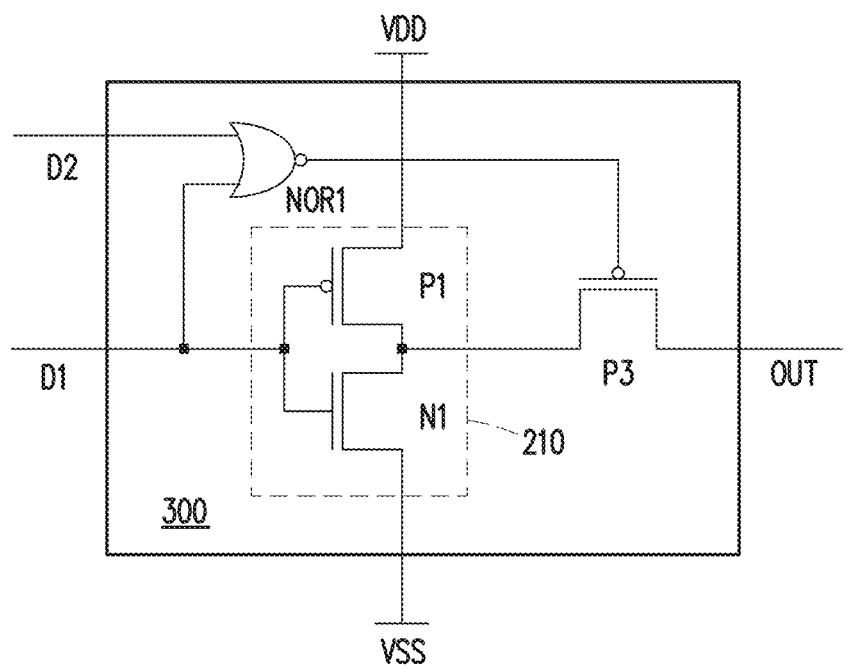
FIG. 3 is a diagram of a driving circuit, in accordance with some embodiments.

FIG. 3 is a diagram of a driving circuit 300, in accordance with some embodiments. Driving circuit 300 is usable as a driving circuit 122 discussed above with respect to FIG. 1.

Driving circuit 300 includes write driver 210, which includes transistors N1 and P1, discussed above with respect to FIG. 2, but does not include inverter INV1 or transistor P2 of interrupt circuit 220. In addition to write driver 210, driving circuit 300 includes a node INT, NOR gate NOR1, and PMOS transistor P3.

Write driver 210 includes transistors N1 and P1 electrically coupled in series between power supply node VDD and reference node VSS, with the source of transistor N1 electrically coupled with reference node VSS, and the source of transistor P1 electrically coupled with power supply node VDD.

The drains of transistors N1 and P1 are electrically coupled with node INT, and transistor P3 is coupled between node INT and output node OUT. One of a source or drain of transistor P3 is electrically coupled with node INT, and the other of the source or drain of transistor P3 is electrically coupled with output node OUT. A gate of transistor P3 is communicatively coupled with an output terminal (not labeled) of NOR gate NOR1.

In addition to the output terminal, NOR gate NOR1 includes two input terminals (not labeled). A first input terminal is communicatively coupled with input node D1, and a second input terminal is communicatively coupled with input node D2.

In operation, the low logical state at input node D1 is received at the gates of transistors N1 and P1, thereby turning off transistor N1 and decoupling node INT from reference node VSS, and turning on transistor P1 and electrically coupling node INT with power supply node VDD. Conversely, the high logical state at input node D1 is received at the gates of transistors N1 and P1, thereby turning on transistor N1 and electrically coupling node INT with reference node VSS, and turning off transistor P1 and decoupling node INT from power supply node VDD.

In operation, the logical state received at input node D1 is received at the first input terminal of NOR gate NOR1, and the logical state received at input node D2 is received at the second input terminal of NOR gate NOR1.

In operation, the high logical state at input node D2 received at the second input of NOR gate NOR1 causes the output terminal of NOR gate NOR1, and thereby the gate of transistor P3, to have the low logical state for each of the low and high logical states at input node D1. In response to the low logical state at the gate of transistor P3, transistor P3 is turned on, thereby electrically coupling node INT with output node OUT.

In operation, the low logical state at input node D2 received at the second input terminal of NOR gate NOR1 causes the output terminal of NOR gate NOR1, and thereby the gate of transistor P3, to have a logical state based on the logical state at input node D1.

In this case, the low logical state at input node D1 received at the first input terminal of NOR gate NOR1 causes the output terminal of NOR gate NOR1, and thereby the gate of transistor P3, to have the high logical state, thereby turning off transistor P3 and decoupling node INT from output node OUT. The high logical state at input node D1 received at the first input terminal of NOR gate NOR1 causes the output terminal of NOR gate NOR1, and thereby the gate of transistor P3, to have the low logical state, thereby turning on transistor P3 and electrically coupling node INT with output node OUT.

In operation, the low logical state at input nodes D1 and D2, by turning off transistors N1 and P3, decouples output node OUT from node INT and therefore both reference node VSS and power supply node VDD, thereby floating output node OUT by having a high impedance at output node OUT.

In operation, the low logical state at input node D1 and the high logical state at input node D2, by turning off transistor N1 and turning on transistors P1 and P3, decouples output node OUT from reference node VSS and electrically couples output node OUT with power supply node VDD via node INT, thereby outputting the power supply voltage level on output node OUT.

In operation, the high logical state at input node D1 and the low logical state at input node D2, by turning on transistors N1 and P3, and turning off transistor P1, electrically couples output node OUT with reference node VSS via node INT, and decouples output node OUT from power supply node VDD, thereby outputting the reference voltage level on output node OUT.

In operation, the high logical state at input node D1 and the high logical state at input node D2, by turning on transistors N1 and P3, and turning off transistor P1, electrically couples output node OUT with reference node VSS via node INT, and decouples output node OUT from power supply node VDD, thereby outputting the reference voltage level on output node OUT.

By the configuration discussed above, driving circuit 300 is capable of enabling the benefits discussed above with respect to memory circuit 100 and FIG. 1.

Figure 4:
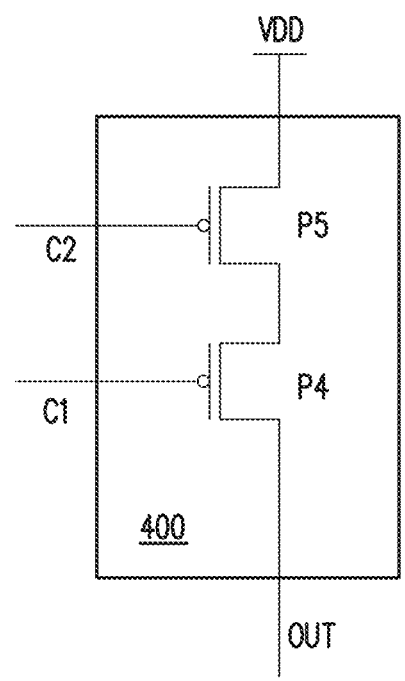
FIG. 4 is a diagram of a pre-charge circuit, in accordance with some embodiments.

FIG. 4 is a diagram of a pre-charge circuit 400, in accordance with some embodiments. Pre-charge circuit 400 is usable as a pre-charge circuit 124 discussed above with respect to FIG. 1.

Pre-charge circuit 400 includes PMOS transistors P4 and P5 electrically coupled in series between power supply node VDD and output node OUT. A drain of transistor P4 is electrically coupled with output node OUT, a source of transistor P4 is electrically coupled with a drain of transistor P5, and a source of transistor P5 is electrically coupled with power supply node VDD. A gate of transistor P4 is communicatively coupled with input node C1, and a gate of transistor P5 is communicatively coupled with input node C2.

In operation, the low logical state at input node C1 is received at the gate of transistor P4, thereby causing transistor P4 to turn on, electrically coupling output node OUT with the drain of transistor P5. The high logical state at input node C1 is received at the gate of transistor P4, thereby causing transistor P4 to turn off, electrically decoupling output node OUT from the drain of transistor P5, and thereby from power supply node VDD.

In operation, the low logical state at input node C2 is received at the gate of transistor P5, thereby causing transistor P5 to turn on, electrically coupling the source of transistor P4 with power supply node VDD. The high logical state at input node C2 is received at the gate of transistor P5, thereby causing transistor P5 to turn off, electrically decoupling the source of transistor P4, and thereby output node OUT, from power supply node VDD.

Pre-charge circuit 400 is thereby configured so that, in operation, the high logical state at either of input nodes C1 or C2 causes output node OUT to be decoupled from power supply node VDD, and the low logical state at both of input nodes C1 and C2 causes output node OUT to be electrically coupled with power supply node VDD.

By the configuration discussed above, pre-charge circuit 400 is capable of enabling the benefits discussed above with respect to memory circuit 100 and FIG. 1.

Figure 5:
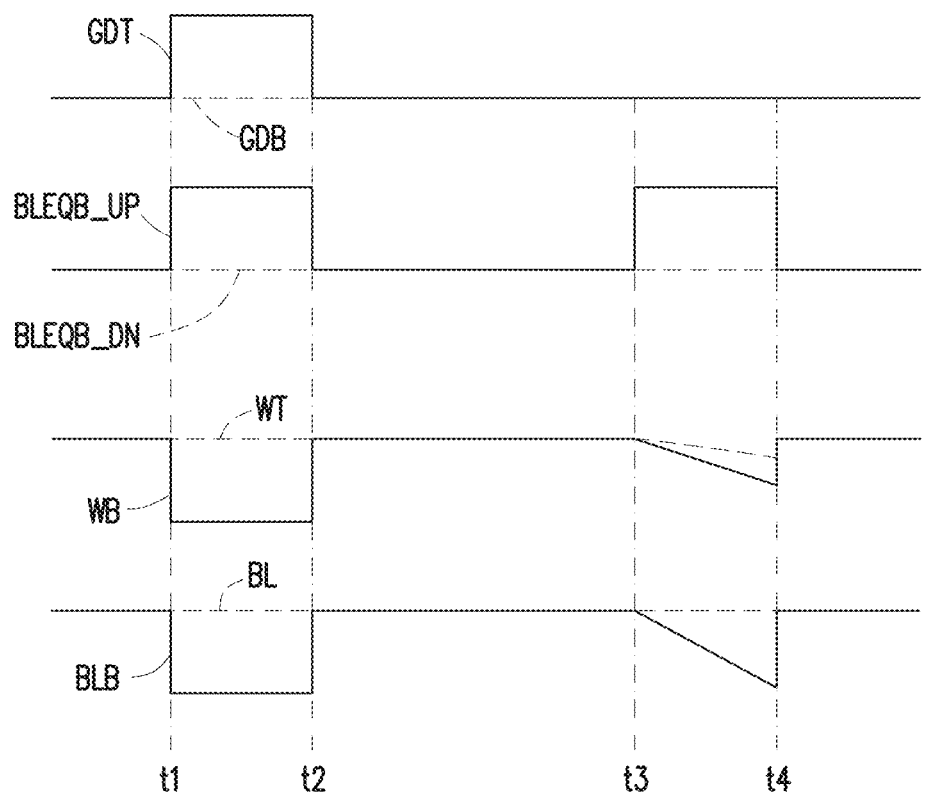
FIG. 5 is a plot of memory circuit operating parameters, in accordance with some embodiments.

FIG. 5 is a plot of memory circuit operating parameters, in accordance with some embodiments. FIG. 5 depicts non-limiting examples of data signals GDT and GDB, enable signals BLEQB_UP and BLEQB_DN, write line signals WB and WT, each discussed above with respect to FIG. 1, and two bit line voltages BL and BLB. Bit line voltages BL and BLB represent non-limiting examples of voltage levels on one pair of bit line pairs BL[n]/BLB[n] discussed above with respect to FIG. 1.

An interval from a time t1 to a time t2 represents a first write operation in which a data bit is written to a selected memory cell 116 in segment 110U corresponding to the bit line pair BL[n]/BLB[n]. An interval from a time t3 to a time t4 represents a second write operation in which the selected memory cell 116 is masked. Timing and control of the various signals during the write operations are based on one or more signals, e.g., a clock signal or a mask enable signal, that are not depicted for the purpose of clarity.

Prior to time t1, each of data signals GDT and GDB is at the low logical state. At time t1, the start of the first write operation, data signal GDT transitions from the logically low state to the logically high state, and data signal GDB remains at the low logical state, the differing logical states representing the data bit. In a complementary write operation (not depicted), a complementary data bit is represented by data signal GDB transitioning from the logically low state to the logically high state, and data signal GDT remaining at the low logical state.

At time t2, the end of the first write operation, data signal GDT transitions from the logically high state back to the logically low state, and data signal GDB remains at the logically low state.

From time t3 to time t4, each of data signals GDT and GDB remains at the logically low state, corresponding to the selected memory cell 116 being masked in the second write operation.

From time t1 to time t2, enable signal BLEQB_UP toggles from the logically low state to the logically high state, and back to the logically low state, corresponding to the memory cell 116 in segment 110U being selected in the first write operation. Enable signal BLEQB_DN remains at the logically low state because a memory cell 116 in segment 110D is not selected in the first write operation.

From time t3 to time t4, enable signal BLEQB_UP toggles from the logically low state to the logically high state, and back to the logically low state, corresponding to the memory cell 116 in segment 110U being selected in the second write operation while enable signal BLEQB_DN remains at the logically low state because a memory cell 116 in segment 110D is not selected in the second write operation.

In the non-limiting example depicted in FIG. 5, an enable signal BLEQB_UP or BLEQB_DN having the logically low state corresponds to a given bit line pre-charger 114 being activated to charge a corresponding bit line pair BL[n]/BLB[n] to the power supply voltage level. An enable signal BLEQB_UP or BLEQB_DN having the logically high state corresponds to the bit line pre-charger 114 being deactivated.

The bit line pre-charger 114 corresponding to the selected memory cell 116 is therefore deactivated during both the first and second write operations based on enable signal BLEQB_UP toggling to the logically high state, and otherwise activated to charge the bit line pair BL[n]/BLB[n] corresponding to the selected memory cell 116 to the power supply voltage level. Each of bit line voltages BL and BLB is thereby charged to the high logical state before time t1, from time t2 to time t3, and after time t4.

In the non-limiting example depicted in FIG. 5, both of enable signals BLEQB_UP and BLEQB_DN having the logically low state corresponds to a given pre-charge circuit 124 outputting the power supply voltage level to a corresponding output node. One or both of enable signals BLEQB_UP or BLEQB_DN having the logically high state corresponds to the given pre-charge circuit 124 floating the corresponding output node.

Pre-charge circuits 124 of write line circuits 120T and 120B therefore float respective write lines WLT and WLB during the first and second write operations, and output the power supply voltage level to respective write lines WLT and WLB before time t1, from time t2 to time t3, and after time t4.

During both the first and second write operations, based on the selection of the memory cell 116, bit line pair BL[n]/BLB[n] is electrically coupled with respective write lines WLT and WLB. Because the bit line pre-charger 114 corresponding to the selected memory cell 116 is deactivated, and write line circuits 120T and 120B float respective write lines WLT and WLB, write line signals WT and WB correspond to respective bit line voltages BL and BLB during the first and second write operations.

During the first write operation, from time t1 to time t2, write line signal WB and bit line voltage BLB toggle from the logically high state to the logically low state and back to the logically high state, corresponding to driving circuit 122 of write line circuit 120B outputting the reference voltage level to write line WLB in response to receiving the high logical state of data signal GDT and the low logical state of data signal GDB.

During the first write operation, from time t1 to time t2, write line signal WT and bit line voltage BL remain at the logically high state, corresponding to driving circuit 122 of write line circuit 120T outputting the power supply voltage level to write line WLT in response to receiving the low logical state of data signal GDB and the high logical state of data signal GDT.

During the second write operation, from time t3 to time t4, because the bit line pre-charger 114 corresponding to the selected memory cell 116 is deactivated, and each of write lines WLT and WLB is floating with respect to write line circuits 120T and 120B, write line signals WT and WB and bit line voltages BL and BLB are controlled by the logical states stored in the selected memory cell 116 during the first write operation.

Because write line signal WT and bit line voltage BL store the logically high state in the selected memory cell 116 during the first write operation, the selected memory cell 116 causes write line signal WT and bit line voltage BL to remain at the logically high state during the second write operation.

Because write line signal WB and bit line voltage BLB cause the logically low state to be stored in the selected memory cell 116 during the first write operation, the selected memory cell 116 causes write line signal WB and bit line voltage BLB to move toward the logically low state during the second write operation. The selected memory cell causing the write line signal WB and bit line voltage BLB to move toward the logically low state is also referred to as a dummy read operation.

The rates at which each of write line signal WB and bit line voltage BLB move toward the logically low state is based on a current driving capacity of the selected memory cell 116 and distributed parasitic resistance and capacitance values of write line WLB and the bit line BLB and selection circuit 112 corresponding to the selected memory cell 116.

In the embodiment depicted in FIG. 5, because bit line BLB [n] is between the corresponding selected memory cell 116 and write line WLB, the distributed parasitic resistance and capacitance values cause the selected memory cell 116 to move bit line voltage BLB faster than write line WLB toward the logically low state.

FIG. 6 is a flowchart of a method 600 of floating a data line, in accordance with one or more embodiments. Method 600 is usable with a memory circuit, e.g., memory circuit 100 discussed above with respect to FIG. 1.

The sequence in which the operations of method 600 are depicted in FIG. 6 is for illustration only; the operations of method 600 are capable of being executed in sequences that differ from that depicted in FIG. 6. In some embodiments, operations in addition to those depicted in FIG. 6 are performed before, between, during, and/or after the operations depicted in FIG. 6. In some embodiments, the operations of method 600 are a subset of operations of a method of operating a memory circuit.

At operation 610, in some embodiments, a data line is coupled with a power supply node using a pre-charging circuit. The power supply node carries a power supply voltage level, and coupling the data line with the power supply node causes the data line to have the power supply voltage level.

In some embodiments, at least one of the power supply node is one power supply node of a plurality of power supply nodes, the data line is one data line of a plurality of data lines, or the pre-charging circuit is one pre-charging circuit of a plurality of pre-charging circuits, and coupling the data line with the power supply node includes at least one of coupling more than one data line of the plurality of data lines, coupling with more than one power supply node of the plurality of power supply nodes, or using more than one pre-charging circuit of the plurality of pre-charging circuits.

The pre-charging circuit couples the data line with the power supply node in response to one or more logical states of a control signal or plurality of control signals. In various embodiments, at least one of the control signal or the plurality of control signals is an enable signal, and a bit line pre-charger of the memory circuit responds to the enable signal by pre-charging a bit line pair associated with the pre-charging circuit. In some embodiments, a control signal is a signal that is separate from an enable signal and based on one or more enable signals.

In some embodiments, the one or more control signals change logical states in response to the end of a write operation on one or more memory cells associated with the pre-charging circuit. In some embodiments, the write operation includes writing data bits to each of one or more memory cells and masking the writing of data bits to each of one or more other memory cells.

In some embodiments, coupling the data line with the power supply node includes coupling write line WLB or WLT with power supply node VDD using pre-charge circuit 124, each discussed above with respect to FIG. 1.

In some embodiments, coupling the data line with the power supply node includes using a switching device. In some embodiments, coupling the data line with the power supply node includes using one or both of transistors P4 or P5 of pre-charging circuit 400, discussed above with respect to FIG. 4.

At operation 620, in some embodiments, the data line is decoupled from the power supply node using the pre-charging circuit. Decoupling the data line from the power supply node is performed by reversing operation 610 for each of the embodiments discussed above, and includes the pre-charging circuit having a high output impedance with reference to the data line.

The pre-charging circuit decouples the data line from the power supply node in response to one or more logical states of the one or more control signals being different from the one or more logical states that cause the pre-charging circuit to couple the data line with the power supply node. In some embodiments, the one or more control signals change logical states in response to the start of a write operation on the one or more memory cells associated with the pre-charging circuit. In some embodiments, the write operation includes writing data bits to each of one or more memory cells and masking the writing of data bits to each of one or more other memory cells.

Decoupling the data line from the power supply node is performed so that the data line is decoupled from the power supply node using the pre-charging circuit concurrently with operations 630, 640, and in some embodiments 660, each discussed below.

At operation 630, a first data signal is received at a first input node of a driving circuit coupled with the data line, the power supply node, and a reference node, and a second data signal is received at a second input node of the driving circuit. The first and second data signals are generated by the memory circuit and have logical states corresponding to a write operation in which writing a data bit to a memory cell associated with the driving circuit is masked.

In various embodiments, in the masked write operation, the memory circuit generates the first and second data signals each having the logically low state, each having the logically high state, the first data signal having the logically low state and the second data signal having the logically high state, or the first data signal having the logically high state and the second data signal having the logically low state.

In some embodiments, receiving the first and second data signals includes receiving the first and second data signals at respective input nodes D1 and D2 of write line circuit 120B or 120T, discussed above with respect to memory circuit 100 and FIG. 1.

In some embodiments, receiving the first and second data signals includes receiving the first data signal with write driver 210 and the second data signal with interrupt circuit 220, discussed above with respect to driving circuit 200 and FIG. 2. In some embodiments, receiving the first and second data signals includes receiving the first data signal with write driver 210 and NOR gate NOR1, and receiving the second data signal with NOR gate NOR1, discussed above with respect to driving circuit 300 and FIG. 3.

At operation 640, in response to the first data signal and the second data signal, the driving circuit is used to decouple the data line from the power supply node and the reference node. Decoupling the data line from the power supply node and the reference node includes the driving circuit having a high output impedance with reference to the data line.

The driving circuit decouples the data line from the power supply node and the reference node in response to the first and second data signals having the logical states corresponding to the write operation in which writing the data bit to the memory cell associated with the driving circuit is masked.

In some embodiments, decoupling the data line from the power supply node and the reference node includes using write line circuit 120B or 120T to decouple write line WLB or WLT from power supply node VDD and reference node VSS, discussed above with respect to memory circuit 100 and FIG. 1.

In some embodiments, using the driving circuit to decouple the data line from the power supply node includes decoupling the data line from the power supply node in response to the second data signal. In some embodiments, using the driving circuit to decouple the data line from the power supply node includes decoupling write driver 210 from power supply node VDD using interrupt circuit 220, discussed above with respect to driving circuit 200 and FIG. 2.

In some embodiments, using the driving circuit to decouple the data line from the reference node includes the driving circuit responding to the first data signal. In some embodiments, using the driving circuit to decouple the data line from the reference node includes turning off transistor N1 in response to the first data signal received at input node D1, discussed above with respect to driving circuits 200 and 300 and FIGS. 1 and 2.

In some embodiments, using the driving circuit to decouple the data line from the power supply node includes decoupling the data line from the power supply node in response to the first and second data signals. In some embodiments, using the driving circuit to decouple the data line from the power supply node includes decoupling output node OUT from write driver 210 using NOR gate NOR1 and transistor P3, discussed above with respect to driving circuit 300 and FIG. 3.

At operation 650, in some embodiments, operation 610 is repeated, and the data line is coupled with the power supply node using the pre-charging circuit.

At operation 660, in some embodiments, the driving circuit is used to output a write line signal having one of a power supply voltage level or a reference voltage level on the data line. Outputting the write line signal having the power supply voltage level includes outputting the power supply voltage level carried on the power supply node, and outputting the write line signal having the reference voltage level includes outputting the reference voltage level carried on the reference node.

Outputting the write line signal having one of the power supply voltage level or the reference voltage level on the data line is in response to the first and second data signals having logical states corresponding to a write operation in which writing a data bit to the memory cell associated with the driving circuit is not masked.

In various embodiments, in the non-masked write operation, the memory circuit generates the first and second data signals each having the logically low state, each having the logically high state, the first data signal having the logically low state and the second data signal having the logically high state, or the first data signal having the logically high state and the second data signal having the logically low state.

In various embodiments, outputting one of the power supply voltage level or the reference voltage level on the data line is performed after operation 650 and/or before operation 610.

By executing some or all of the operations of method 600, a data line is caused to float during a masked write operation, thereby obtaining the benefits discussed above with respect to memory circuit 100 and FIG. 1.

In some embodiments, a memory circuit includes first and second memory segments, first and second write lines coupled to each of the first and second memory segments, a first write line circuit coupled to the first write line and configured to receive first and second data signals, and a second write line circuit coupled to the second write line and configured to receive the first and second data signals, wherein the memory circuit is configured to cause the first and second data signals to have complementary low and high logical states during a write operation to the first or second memory segment, and cause each of the first and second data signals to have the low logical state during a masked write operation to the first or second memory segment, the first write line circuit is configured to output, to the first write line, a first write line signal responsive to the first data signal during the write operation and float the first data line during the masked write operation, and the second write line circuit is configured to output, to the second write line, a second write line signal responsive to the second data signal during the write operation and float the second data line during the masked write operation. In some embodiments, each of the first and second write line circuits includes first and second PMOS transistors coupled in series between a power supply node and the corresponding first or second write line, an NMOS transistor coupled between the corresponding first or second write line and a reference node, and an inverter coupled to a gate of the first PMOS transistor, gates of the NMOS and second PMOS transistors of the first write line circuit and the inverter of the second write line circuit are configured to receive the first data signal, and gates of the NMOS and second PMOS transistors of the second write line circuit and the inverter of the first write line circuit are configured to receive the second data signal. In some embodiments, each of the first and second write line circuits includes first and second PMOS transistors coupled in series at a first node between a power supply node and the corresponding first or second write line, an NMOS transistor coupled between the first node and a reference node, and a NOR gate coupled to a gate of the first PMOS transistor and configured to receive each of the first and second data signals, gates of the NMOS and second PMOS transistors of the first write line circuit are configured to receive the first data signal, and gates of the NMOS and second PMOS transistors of the second write line circuit are configured to receive the second data signal. In some embodiments, the memory circuit includes first and second pre-charge circuits coupled to the respective first and second write lines, wherein each of the first and second pre-charge circuits includes first and second PMOS transistors coupled in series between a power supply node and the corresponding first or second write line, a gate of the first PMOS transistor is configured to receive a first bit line enable signal configured to have the high logical state during each of the write and masked write operations to the first memory segment, and a gate of the second PMOS transistor is configured to receive a second bit line enable signal configured to have the high logical state during each of the write and masked write operations to the second memory segment. In some embodiments, each of the first and second bit line enable signals is configured to have the low logical state between the write and masked write operations to the respective first and second memory segments. In some embodiments, each of the first and second memory segments includes a plurality of bit line pairs coupled between corresponding memory cells and the first and second write lines, and a plurality of bit line pre-charge circuits coupled to corresponding bit line pairs of the plurality of bit line pairs, wherein each bit line pre-charge circuit of the plurality of bit line pre-charge circuits of the first memory segment is configured to receive the first bit line enable signal, and each bit line pre-charge circuit of the plurality of bit line pre-charge circuits of the second memory segment is configured to receive the second bit line enable signal. In some embodiments, each of the first and second memory segments includes a multiplexer configured to selectively couple each bit line pair of the plurality of bit line pairs to the first and second write lines. In some embodiments, the first memory segment is oriented in an upward direction relative to the first and second write line circuits, and the second memory segment is oriented in a downward direction relative to the first and second write line circuits. In some embodiments, each of the first and second memory segments includes a plurality of SRAM cells.

In some embodiments, a memory circuit includes first and second memory segments, first and second write lines coupled to each of the first and second memory segments, a first write line circuit coupled to the first write line and configured to receive first and second data signals, and a second write line circuit coupled to the second write line and configured to receive the first and second data signals, wherein the memory circuit is configured to cause the first and second data signals to have complementary low and high logical states during a write operation to the first or second memory segment, and cause each of the first and second data signals to have the low logical state during a masked write operation to the first or second memory segment, the first write line circuit includes a first inverter configured to output, to the first write line, a first write line signal complementary to the first data signal during the write operation and is configured float the first data line during the masked write operation, and the second write line circuit includes a second inverter configured to output, to the second write line, a second write line signal complementary to the second data signal during the write operation and is configured to float the second data line during the masked write operation. In some embodiments, each of the first and second write line circuits includes a first PMOS transistor coupled in series between a power supply node and the inverter, the inverter including a second PMOS transistor and an NMOS transistor coupled to the corresponding first or second write line, the NMOS transistor coupled between the corresponding first or second write line and a reference node, and an inverting logic gate coupled to a gate of the first PMOS transistor, gates of the NMOS and second PMOS transistors of the inverter of the first write line circuit and the inverting logic gate of the second write line circuit are configured to receive the first data signal, and gates of the NMOS and second PMOS transistors of the inverter of the second write line circuit and the inverting logic gate of the first write line circuit are configured to receive the second data signal. In some embodiments, each of the first and second write line circuits includes the inverter including a first PMOS transistor and an NMOS transistor coupled in series between a power supply node and a reference node, a second PMOS transistor coupled between the inverter and the corresponding first or second write line, and a NOR gate coupled to a gate of the second PMOS transistor and configured to receive each of the first and second data signals, gates of the NMOS and first PMOS transistors of the inverter of the first write line circuit are configured to receive the first data signal, and gates of the NMOS and first PMOS transistors of the inverter of the second write line circuit are configured to receive the second data signal. In some embodiments, the memory circuit includes first and second PMOS transistors coupled in series between a power supply node and the first write line, and third and fourth PMOS transistors coupled in series between the power supply node and the second write line, wherein gates of the first and third PMOS transistors are configured to receive a first bit line enable signal configured to have the high logical state during each of the write and masked write operations to the first memory segment, and gates of the second and fourth PMOS transistors are configured to receive a second bit line enable signal configured to have the high logical state during each of the write and masked write operations to the second memory segment. In some embodiments, the first bit line enable signal is configured to have the low logical state between the write and masked write operations to the first memory segment, and the second bit line enable signal is configured to have the low logical state between the write and masked write operations to the second memory segment. In some embodiments, each of the first and second memory segments includes a plurality of bit line pre-charge circuits coupled to corresponding bit line pairs of a plurality of bit line pairs coupled between corresponding memory cells and the first and second write lines, wherein each bit line pre-charge circuit of the plurality of bit line pre-charge circuits of the first memory segment is configured to receive the first bit line enable signal, and each bit line pre-charge circuit of the plurality of bit line pre-charge circuits of the second memory segment is configured to receive the second bit line enable signal. In some embodiments, each of the first and second memory segments includes a multiplexer configured to selectively couple each bit line pair of the plurality of bit line pairs to the first and second write lines. In some embodiments, the memory cells of each of the first and second memory segments comprise SRAM cells.

In some embodiments, a method of operating a memory circuit includes, during a write operation to first or second memory segments coupled to first and second write lines, receiving, at each of a first write line circuit coupled to the first write line and a second write line circuit coupled to the second write line, first and second data signals having complementary low and high logical states, responsive to the first data signal, outputting a first write line signal from the first write line circuit to the first write line, and responsive to the second data signal, outputting a second write line signal from the second write line circuit to the second write line, and during a masked write operation to the first or second memory segments, receiving, at each of the first and second write line circuits, each of the first and second data signals having the low logical state, and responsive to the first and second data signals, using the first and second write line circuits to float the first and second write lines. In some embodiments, the method includes receiving, at a gate of a first PMOS transistor coupled between the first write line and a power supply node and at a gate of a second PMOS transistor coupled between the second write line and the power supply node, a first bit line enable signal having a high logical state during each of the write and masked write operations to the first memory segment, and receiving, at a gate of a third PMOS transistor coupled between the first write line and the power supply node and at a gate of a fourth PMOS transistor coupled between the second write line and the power supply node, a second bit line enable signal having the high logical state during each of the write and masked write operations to the second memory segment. In some embodiments, the method includes receiving the first bit line enable signal at the gates of each of the first and second PMOS transistors having the low logical state between the write and masked write operations to the first memory segment, and receiving the second bit line enable signal at the gates of each of the third and fourth PMOS transistors having the low logical state between the write and masked write operations to the second memory segment.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory circuit comprising:
   first and second memory segments;
   first and second write lines coupled to each of the first and second memory segments;
   a first write line circuit coupled to the first write line and configured to receive first and second data signals; and
   a second write line circuit coupled to the second write line and configured to receive the first and second data signals,
   wherein
      the memory circuit is configured to:
         cause the first and second data signals to have complementary low and high logical states during a write operation to the first or second memory segment, and
         cause each of the first and second data signals to have the low logical state during a masked write operation to the first or second memory segment, the first write line circuit is configured to:
         output, to the first write line, a first write line signal responsive to the first data signal during the write operation, and float the first write line during the masked write operation, and the second write line circuit is configured to:
output, to the second write line, a second write line signal responsive to the second data signal during the write operation, and
float the second write line during the masked write operation.

2. The memory circuit of claim 1, wherein
each of the first and second write line circuits comprises:
first and second PMOS transistors coupled in series between a power supply node and the corresponding first or second write line;
an NMOS transistor coupled between the corresponding first or second write line and a reference node; and
an inverter coupled to a gate of the first PMOS transistor,
gates of the NMOS and second PMOS transistors of the first write line circuit and the inverter of the second write line circuit are configured to receive the first data signal, and
gates of the NMOS and second PMOS transistors of the second write line circuit and the inverter of the first write line circuit are configured to receive the second data signal.

3. The memory circuit of claim 1, wherein
each of the first and second write line circuits comprises:
first and second PMOS transistors coupled in series at a first node between a power supply node and the corresponding first or second write line;
an NMOS transistor coupled between the first node and a reference node; and
a NOR gate coupled to a gate of the first PMOS transistor and configured to receive each of the first and second data signals,
gates of the NMOS and second PMOS transistors of the first write line circuit are configured to receive the first data signal, and
gates of the NMOS and second PMOS transistors of the second write line circuit are configured to receive the second data signal.

4. The memory circuit of claim 1, further comprising:
first and second pre-charge circuits coupled to the respective first and second write lines, wherein
each of the first and second pre-charge circuits comprises first and second PMOS transistors coupled in series between a power supply node and the corresponding first or second write line,
a gate of the first PMOS transistor is configured to receive a first bit line enable signal configured to have the high logical state during each of the write and masked write operations to the first memory segment, and
a gate of the second PMOS transistor is configured to receive a second bit line enable signal configured to have the high logical state during each of the write and masked write operations to the second memory segment.

5. The memory circuit of claim 4, wherein
each of the first and second bit line enable signals is configured to have the low logical state between the write and masked write operations to the respective first and second memory segments.

6. The memory circuit of claim 4, wherein each of the first and second memory segments comprises:
a plurality of bit line pairs coupled between corresponding memory cells and the first and second write lines; and
a plurality of bit line pre-charge circuits coupled to corresponding bit line pairs of the plurality of bit line pairs,
wherein
each bit line pre-charge circuit of the plurality of bit line pre-charge circuits of the first memory segment is configured to receive the first bit line enable signal, and
each bit line pre-charge circuit of the plurality of bit line pre-charge circuits of the second memory segment is configured to receive the second bit line enable signal.

7. The memory circuit of claim 6, wherein each of the first and second memory segments further comprises:
a multiplexer configured to selectively couple each bit line pair of the plurality of bit line pairs to the first and second write lines.

8. The memory circuit of claim 1, wherein
the first memory segment is oriented in an upward direction relative to the first and second write line circuits, and
the second memory segment is oriented in a downward direction relative to the first and second write line circuits.

9. The memory circuit of claim 1, wherein each of the first and second memory segments comprises a plurality of static random-access memory (SRAM) cells.

10. A memory circuit comprising:
first and second memory segments;
first and second write lines coupled to each of the first and second memory segments;
a first write line circuit coupled to the first write line and configured to receive first and second data signals; and
a second write line circuit coupled to the second write line and configured to receive the first and second data signals,
wherein
the memory circuit is configured to:
cause the first and second data signals to have complementary low and high logical states during a write operation to the first or second memory segment, and
cause each of the first and second data signals to have the low logical state during a masked write operation to the first or second memory segment,
the first write line circuit:
comprises a first inverter configured to output, to the first write line, a first write line signal complementary to the first data signal during the write operation, and
is configured float the first write line during the masked write operation, and
the second write line circuit:
comprises a second inverter configured to output, to the second write line, a second write line signal complementary to the second data signal during the write operation, and
is configured to float the second write line during the masked write operation.

11. The memory circuit of claim 10, wherein
each of the first and second write line circuits comprises:
a first PMOS transistor coupled in series between a power supply node and the inverter;

the inverter comprising a second PMOS transistor and an NMOS transistor coupled to the corresponding first or second write line;

the NMOS transistor coupled between the corresponding first or second write line and a reference node; and an inverting logic gate coupled to a gate of the first PMOS transistor, gates of the NMOS and second PMOS transistors of the inverter of the first write line circuit and the inverting logic gate of the second write line circuit are configured to receive the first data signal, and gates of the NMOS and second PMOS transistors of the inverter of the second write line circuit and the inverting logic gate of the first write line circuit are configured to receive the second data signal.

12. The memory circuit of claim 10, wherein each of the first and second write line circuits comprises:

the inverter comprising a first PMOS transistor and an NMOS transistor coupled in series between a power supply node and a reference node;

a second PMOS transistor coupled between the inverter and the corresponding first or second write line; and a NOR gate coupled to a gate of the second PMOS transistor and configured to receive each of the first and second data signals, gates of the NMOS and first PMOS transistors of the inverter of the first write line circuit are configured to receive the first data signal, and gates of the NMOS and first PMOS transistors of the inverter of the second write line circuit are configured to receive the second data signal.

13. The memory circuit of claim 10, further comprising:

first and second PMOS transistors coupled in series between a power supply node and the first write line; and third and fourth PMOS transistors coupled in series between the power supply node and the second write line, wherein gates of the first and third PMOS transistors are configured to receive a first bit line enable signal configured to have the high logical state during each of the write and masked write operations to the first memory segment, and gates of the second and fourth PMOS transistors are configured to receive a second bit line enable signal configured to have the high logical state during each of the write and masked write operations to the second memory segment.

14. The memory circuit of claim 13, wherein the first bit line enable signal is configured to have the low logical state between the write and masked write operations to the first memory segment, and the second bit line enable signal is configured to have the low logical state between the write and masked write operations to the second memory segment.

15. The memory circuit of claim 13, wherein each of the first and second memory segments comprises:

a plurality of bit line pre-charge circuits coupled to corresponding bit line pairs of a plurality of bit line pairs coupled between corresponding memory cells and the first and second write lines, wherein each bit line pre-charge circuit of the plurality of bit line pre-charge circuits of the first memory segment is configured to receive the first bit line enable signal, and each bit line pre-charge circuit of the plurality of bit line pre-charge circuits of the second memory segment is configured to receive the second bit line enable signal.

16. The memory circuit of claim 15, wherein each of the first and second memory segments further comprises:

a multiplexer configured to selectively couple each bit line pair of the plurality of bit line pairs to the first and second write lines.

17. The memory circuit of claim 15, wherein the memory cells of each of the first and second memory segments comprise static random-access memory (SRAM) cells.

18. A method of operating a memory circuit, the method comprising:

during a write operation to first or second memory segments coupled to first and second write lines:

receiving, at each of a first write line circuit coupled to the first write line and a second write line circuit coupled to the second write line, first and second data signals having complementary low and high logical states;

responsive to the first data signal, outputting a first write line signal from the first write line circuit to the first write line; and responsive to the second data signal, outputting a second write line signal from the second write line circuit to the second write line; and during a masked write operation to the first or second memory segments:

receiving, at each of the first and second write line circuits, each of the first and second data signals having the low logical state; and responsive to the first and second data signals, using the first and second write line circuits to float the first and second write lines.

19. The method of claim 18, further comprising, receiving, at a gate of a first PMOS transistor coupled between the first write line and a power supply node and at a gate of a second PMOS transistor coupled between the second write line and the power supply node, a first bit line enable signal having a high logical state during each of the write and masked write operations to the first memory segment; and receiving, at a gate of a third PMOS transistor coupled between the first write line and the power supply node and at a gate of a fourth PMOS transistor coupled between the second write line and the power supply node, a second bit line enable signal having the high logical state during each of the write and masked write operations to the second memory segment.

20. The method of claim 19, further comprising:

receiving the first bit line enable signal at the gates of each of the first and second PMOS transistors having the low logical state between the write and masked write operations to the first memory segment, and receiving the second bit line enable signal at the gates of each of the third and fourth PMOS transistors having the low logical state between the write and masked write operations to the second memory segment.

* * * * *